(12) United States Patent
Zammattio et al.

(10) Patent No.: US 6,437,636 B2
(45) Date of Patent: Aug. 20, 2002

(54) LOW CONSUMPTION VOLTAGE BOOST DEVICE

(75) Inventors: Matteo Zammattio, Milan; Ilaria Motta, Cassolnovo; Rino Micheloni, Turate; Carla Golla, Sesto San Giovanni, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/747,312

(22) Filed: Dec. 22, 2000

(30) Foreign Application Priority Data

Dec. 30, 1999 (EP) .............................................. 99830825

(51) Int. Cl.[7] .................................................. G05F 1/10
(52) U.S. Cl. ...................................................... 327/536
(58) Field of Search ................................ 327/530, 534, 327/535, 536, 537

(56) References Cited

U.S. PATENT DOCUMENTS

| | | | | |
|---|---|---|---|---|
| 5,337,284 A | * | 8/1994 | Cordoba et al. ............. | 327/540 |
| 5,608,677 A | | 3/1997 | Yoon et al. ............. | 365/189.09 |
| 5,668,762 A | * | 9/1997 | Suwa ..................... | 365/189.11 |
| 5,801,997 A | | 9/1998 | Hsieh et al. ............ | 365/189.11 |
| 5,877,651 A | * | 3/1999 | Furutani .................... | 327/536 |
| 5,880,622 A | | 3/1999 | Evertt et al. ................ | 327/535 |
| 6,018,264 A | * | 1/2000 | Jin ............................ | 327/536 |
| 6,031,411 A | * | 2/2000 | Tsay et al. .................. | 327/534 |
| 6,041,011 A | * | 3/2000 | Umezawa et al. .......... | 327/536 |
| 6,128,242 A | * | 10/2000 | Banba et al. ............... | 365/226 |

* cited by examiner

Primary Examiner—Jeffrey Zweizig
(74) Attorney, Agent, or Firm—Lisa K. Jorgenson; Robert Iannucci; SEED IP Law Group PLLC

(57) ABSTRACT

A voltage boost device includes a first boost stage and a second boost stage connected to an input terminal and to an output terminal, the output terminal supplying an output voltage higher than a supply voltage. The input terminal receives an operating condition signal having a first logic level representative of a standby operating state and a second logic level representative of an active operation state. The first boost stage is enabled in presence of the second logic level of the operating condition signal, and is disabled in presence of the first logic level of the operating condition signal; the second boost stage is controlled in a first operating condition in presence of the first logic level of the operating condition signal, and is controlled in a second operating condition in presence of the second logic level of the operating condition signal.

25 Claims, 3 Drawing Sheets

LOW CONSUMPTION VOLTAGE BOOST DEVICE

TECHNICAL FIELD

The present invention refers to a voltage boost device for nonvolatile memories, which operates in a low consumption standby condition.

BACKGROUND OF THE INVENTION

As is known, nonvolatile memories are used, i.a., in systems comprising various devices and a microprocessor performing instructions and data transfer. In such devices it is important that, while a device is selected for interacting with the microprocessor, all the other devices are disabled, in order to prevent undesirable interference from causing errors.

In order to speed up the processes for enabling and disabling the devices, and hence optimize system performance, when the devices are not selected, they are not turned off (i.e., they are not disconnected from their respective power supply sources), but brought to waiting, or standby, condition. This enables an advantageous reduction in energy consumption to be achieved, as well as the elimination of the danger of interference with processes currently in progress.

On the other hand, in order not to degrade the processing speed of the system, transition from the standby state to the active state must be fast, and transients must be avoided that might slow down execution of the operations requested.

As regards nonvolatile memories in particular, the most critical operation is reading, both because, as compared to other operations, such as programming and erasure, it must be performed in a very short time, and because it is necessary to supply the gate terminals of the cells to be read with high voltages, i.e., higher than the supply voltage. For low supply voltage multilevel memories it is moreover essential for the value of the read voltage supplied to be precise and close to the value of the nominal read voltage.

In order to meet this requirement, a known solution consists in using voltage boosters employing charge pumps and regulation circuits, so as to obtain the required high read voltages and precision when the memory is selected to interact with the microprocessor.

Such voltage boosters, however, have a drawback. In fact, the charge pumps and the regulation circuits have consumption levels which are too high to enable these devices to remain active also while the memory is in standby, and consequently they must be deactivated; on the other hand, when they are not supplied, the output terminals of the charge pumps, which are to supply the read voltage to the gate terminals of the addressed cells to be read, are discharged by leakage currents. Consequently, when the memory returns to the active state from the standby state, it is necessary to wait for a charge transient and it is not possible to reach the necessary read voltage rapidly and with the required precision. In this case, therefore, the reading operation requires a longer time as compared to when the memory is already in the active state.

SUMMARY OF THE INVENTION

The aim of the present invention is to provide a voltage boost device which is free from the drawbacks described above, and in particular which enables a terminal to be kept at a desired voltage during the standby phases, and at the same time has low consumption levels.

A voltage boost device includes a first boost stage and a second boost stage connected to an input terminal and to an output terminal, the output terminal supplying an output voltage higher than a supply voltage. The input terminal receives an operating condition signal having a first logic level representative of a standby operating state and a second logic level representative of an active operation state. The first boost stage is enabled in presence of the second logic level of the operating condition signal, and is disabled in presence of the first logic level of the operating condition signal; the second boost stage is controlled in a first operating condition in presence of the first logic level of the operating condition signal, and is controlled in a second operating condition in presence of the second logic level of the operating condition signal.

BREIF DESCRIPTION OF THE DRAWINGS

For a better understanding of the invention, an embodiment thereof is now described, as a non-limiting example, with reference to the attached drawings, in which.

DETAILED DESCRIPTION OF THE INVENTION

Figure 1:
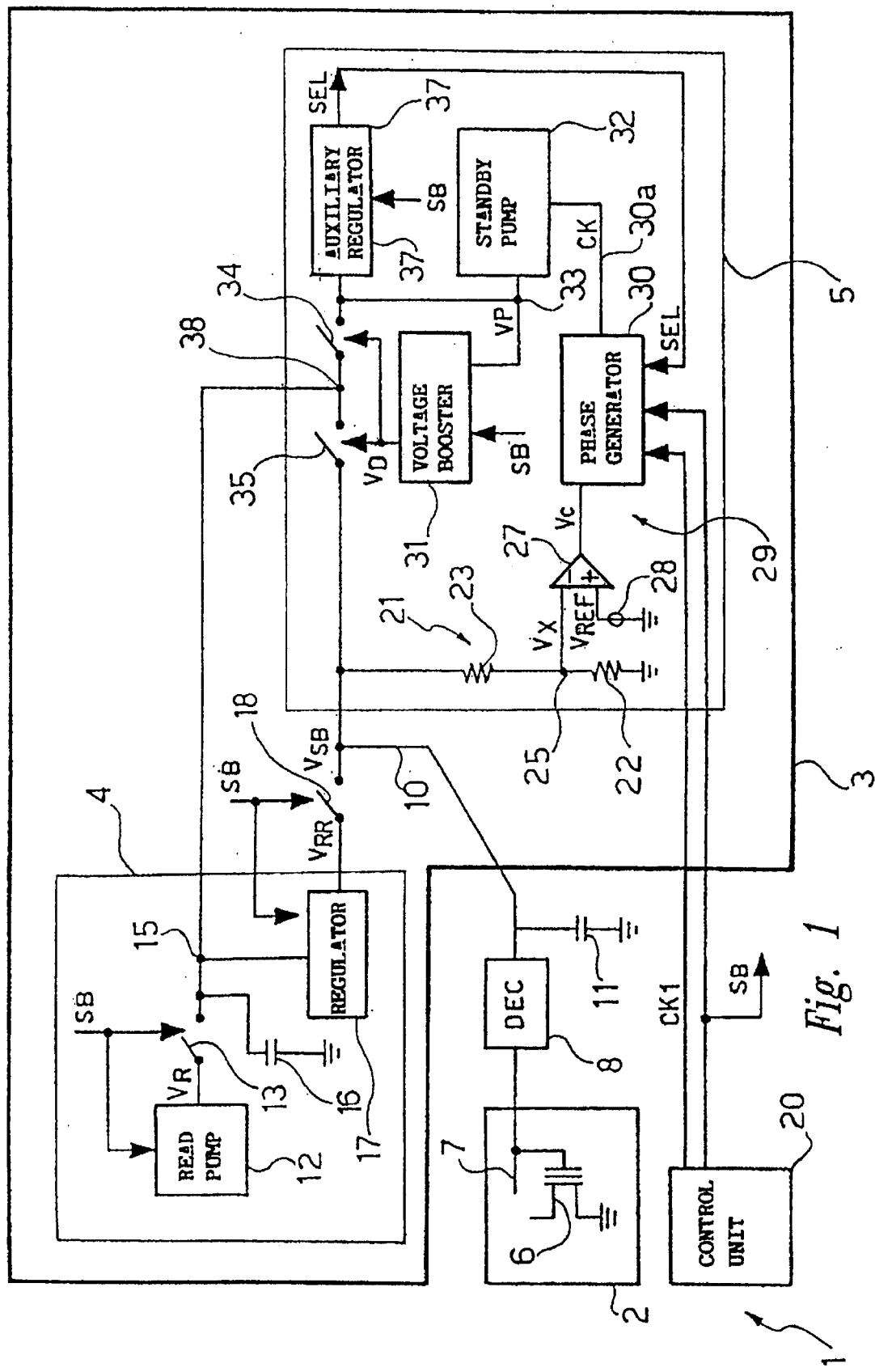
FIG. 1 shows a block diagram of a voltage boost device according to the present invention.

With reference to FIG. 1, a nonvolatile memory 1, for example a four-level flash memory supplied at 3 V, comprises a memory array 2 and a voltage boost device 3 comprising a read voltage boost stage 4 of a known type, which is shown only partially, and a standby voltage boost stage 5.

The memory array 2 comprises a plurality of memory cells 6 arranged on rows and columns. In particular, the memory cells 6 belonging to a same row have their gate terminals connected to a word line 7. A row decoder 8, of known type, connects selectively one of the word lines 7 of the memory array 2 with an output terminal 10 of the voltage boost device 3. In addition, the row decoder 8 has a capacitance represented symbolically by a parasitic capacitor 11 connected between the output terminal 10 and ground.

The read voltage boost stage 4 comprises a read charge pump 12 having an output supplying a read voltage $V_R$ and is connected, via a first switch 13, to a first node 15. The first node 15 is connected to a first terminal of a read capacitor 16, which has a second terminal grounded, and to an input of a voltage regulator 17 having an output supplying a regulated read voltage $V_{RR}$ and connected to the output terminal 10 via a second switch 18. In addition, the read charge pump 12, the voltage regulator 17, and respective control terminals of the first switch 13 and of the second switch 18 receive, from a known control unit 20, a standby signal SB.

The standby voltage boost stage 5 comprises a divider 21, a phase generator 30, a voltage booster 31, a standby charge pump 32, and an auxiliary regulator 37.

In detail, the divider 21 is arranged between the output terminal 10 of the voltage boost device 3 and ground, and comprises a first resistive element 22 and a second resistive element 23 which are connected together at an intermediate node 25, on which an intermediate voltage $V_X$ is present. In addition, the divider 21 has a variable division ratio, as described in detail hereinbelow.

A comparator 27 has an inverting input connected to the intermediate node 25 and a non-inverting input connected to a voltage generator 28, which supplies a constant reference voltage $V_{REF}$. In addition, an output of the comparator 27 is connected to an activation terminal of the phase generator 30. A control signal $V_C$ is supplied by output of the comparator 27 and determines activation and deactivation of the standby charge pump 32 during the standby phase.

The phase generator 30, illustrated in greater detail hereinbelow, is also connected to the control unit 20, from which it receives the standby signal SB and an active operation timing signal CK1 having one first frequency, as well as to an output of the auxiliary regulator 37 supplying a frequency selection signal SEL. In addition, the phase generator 30 has a phase output 30a supplying a phase signal CK.

The divider 21, the comparator 27, and the phase generator 30 form an activation circuit 29 activating the standby charge pump 32, the activation circuit 29 having an input connected to the output terminal 10 of the voltage boost device 3 and an output forming the phase output 30a.

The standby charge pump 32 has an input connected to the phase output 30a and a high voltage output 33, supplying a boosted voltage $V_P$ and connected to the output terminal 10 of the voltage boost device 3 via a first high voltage switch 34 and a second high voltage switches 35, and to the input of the auxiliary regulator 37. In addition, a second node 38, arranged between the first and the second high voltage switch 34, 35, is connected to the first node 15.

The voltage booster 31 has a high voltage input connected to the high voltage output 33 and a control input receiving the standby signal SB. In addition, the voltage booster 31 has an output connected with respective control terminals of the first and second high voltage switches 34, 35 and supplies a driving voltage $V_D$.

The auxiliary regulator 37 has a first input connected to the high voltage output 33 of the standby charge pump 32 and a second input connected to the control unit 20, and receiving the standby signal SB.

During operation of the memory 1 in the standby state, the control unit 20 assigns to the standby signal SB a first logic level, for example a high logic level, thus determining opening of the first and of the second switches 13, 18, and deactivation of the read charge pump 12 and of the voltage regulator 17. In addition, the standby signal SB disables the auxiliary regulator 37, which thus generates a first logic level of the frequency selection signal SEL (for example, a low level), and enables the phase generator 30. The first logic level of the standby signal SB brings the driving voltage $V_D$ of the voltage booster 31 to 0 V, so determining the first and the second high voltage switches 34, 35 to close. The first and the second high voltage switches 34, 35 are preferably formed by PMOS transistors. In addition, when the control signal $V_C$ is at the high logic level (i.e., when the intermediate voltage $V_X$ is lower than the reference voltage $V_{REF}$), the phase generator 30 causes the phase signal CK to oscillate between two preset logic levels at a second frequency, which is determined internally by the phase generator 30. Instead, when the control signal $V_C$ is at the low logic level and in a standby condition, the phase generator 30 maintains the phase signal CK at a preset logic level, for example low, interrupting operation of the standby charge pump 32.

Upon entry into the standby state, a standby voltage $V_{SB}$ is present on the output terminal 10. Standby voltage $V_{SB}$ represents an output voltage of the standby voltage boost stage 5 and is initially equal to the regulated read voltage $V_{RR}$ because of the connection existing (before entry into the standby state) on the output of the voltage regulator 17. In this situation, the intermediate voltage $V_X$, which is proportional to the standby voltage $V_{SB}$ according to the dividing ratio of the divider 21, is at a value slightly higher than the reference voltage $V_{REF}$, and, therefore, the control signal $V_C$ is at the low logic level. Consequently, the phase signal CK remains at low logic level, and the voltage booster 31 keeps the first high voltage switch 34 and the second high voltage switch 35 open.

Subsequently, the standby voltage $V_{SB}$ and the intermediate voltage $V_X$ decrease by virtue of leakage currents and of a current flowing in the divider 21. When the intermediate voltage $V_X$ drops below the reference voltage $V_{REF}$, the control signal $V_C$ switches to the high logic level, and the phase generator 30 causes the phase signal CK to oscillate with a frequency determined by the phase generator 30. When the standby charge pump 32 receives an oscillating signal (i.e., the phase signal CK), it is activated, so determining the sequence of phases of charging and transfer of charge, in a per se known manner.

Since the standby charge pump 32 starts charging the high voltage output 33, the standby voltage $V_{SB}$, which is equal to the boosted voltage $V_P$, and the voltage $V_X$ increase. When the intermediate voltage $V_X$ exceeds the reference voltage $V_{REF}$ (and hence the standby read voltage $V_{SB}$ is slightly higher than the regulated read voltage $V_{RR}$), the control signal $V_C$ returns low, so deactivating the phase generator 30, as explained previously with reference to the description of the entry into the standby state. In this way, the standby voltage regulator stage 5 is activated and deactivated automatically, so as to keep the output terminal 10 charged at the desired value (standby voltage $V_{SB}$), and to enable fast reading when exiting the standby state, at the same time limiting consumption to what is strictly indispensable.

When the memory 2 is set in the active state, control unit 20 sends the standby signal SB to a second logic level, for example the low logic level, causing the switches 13, 18 to close, and the read charge pump 12 and the voltage regulator 17 to be activated. In addition, the standby signal SB sets the driving voltage $V_D$ of the voltage booster 31 to the high value (equal to the boosted voltage $V_P$), keeping the first high voltage switch 34 and the second high voltage switch 35 open. Consequently, the first high voltage switch 34 and the second high voltage switch 35 are kept open, and the high voltage output 33 of the standby charge pump 32 is disconnected from the output terminal 10 and from the first node 15.

During a reading operation, the read charge pump 12 supplies the read voltage $V_R$ to the voltage regulator 17, which, in turn, generates the regulated read voltage $V_{RR}$. This regulated read voltage $V_{RR}$ is supplied to the word line 7 selected by the line decoder 8 for reading the addressed memory cells 6, in a per se known manner.

In the active operation state, the standby charge pump 32 is enabled and driven by the timing signal of the other voltage boosters (not shown) present in the nonvolatile memory 1; it is, however, regulated through the auxiliary regulator 37, as described below. In fact, the auxiliary regulator 37 is active, and the frequency selection signal SEL assumes a logic level that depends upon the value of the boosted voltage $V_P$, which, owing to the presence of leakage currents, decreases. When the boosted voltage $V_P$ drops below a preset threshold, the auxiliary regulator 37 causes the frequency selection signal SEL to switch to a second logic level (e.g., high) which controls the phase generator 30, as described hereinbelow, to transfer the active operation timing signal CK1 to the standby charge pump 32. Consequently, the standby charge pump 32 is activated at the frequency of the active operation timing signal CK1 until the boosted voltage $V_P$ returns above the preset threshold. Then, the frequency selection signal SEL switches and inhibits transfer of the active operation timing signal CK1 to the standby charge pump 32, thus deactivating the latter again.

In this way, in standby, the standby voltage $V_{SB}$ on the output terminal 10 is regulated at a slightly higher value than the regulated read voltage $V_{RR}$ (present in the active operation state). In addition, when the memory 1 is in the active state, the high voltage output 33 of the standby charge pump 32 is regulated at the value of the regulated read voltage $V_{RR}$.

Figure 2:
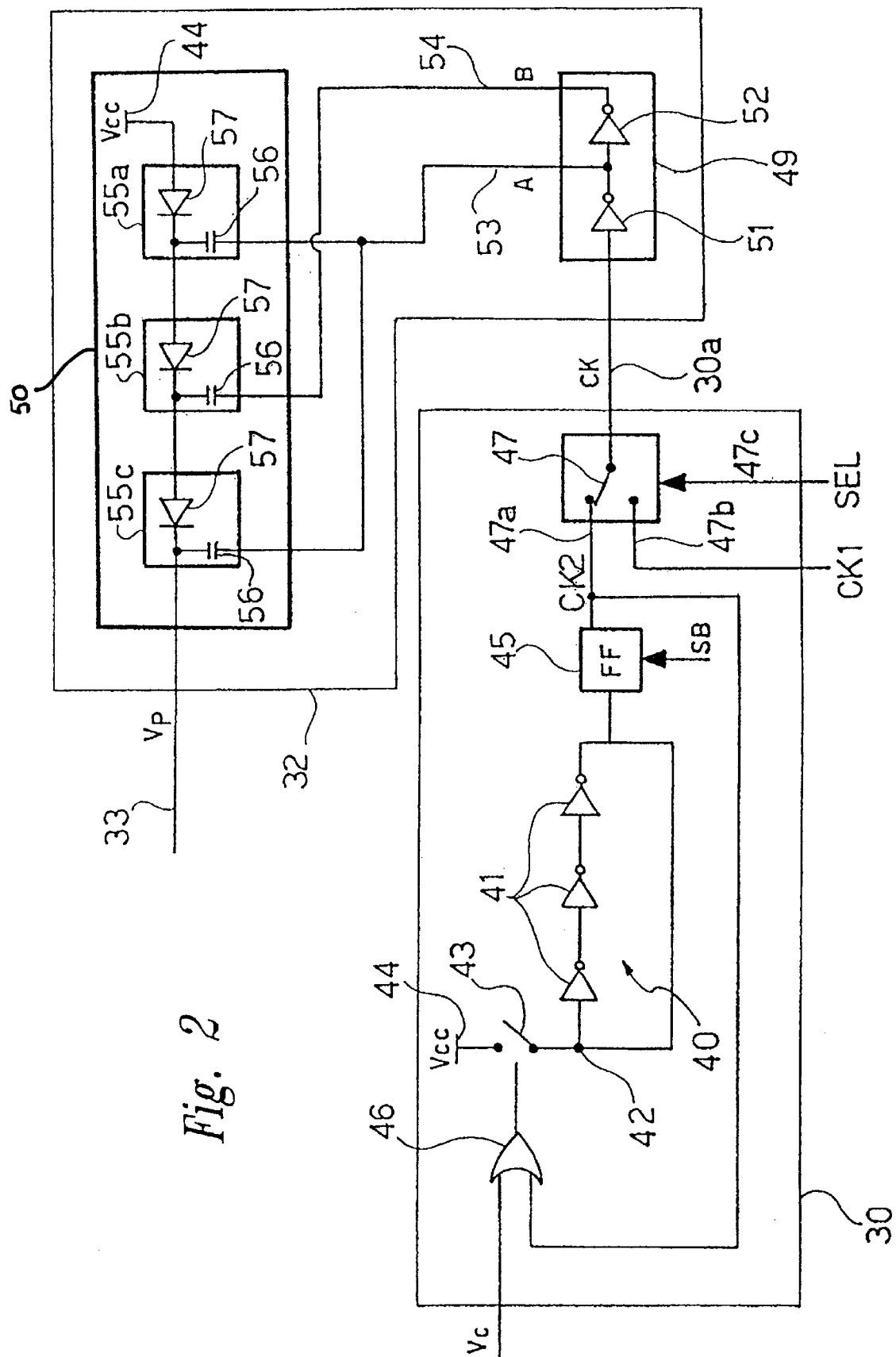
FIG. 2 shows a more detailed diagram of two blocks of the device of FIG. 1.

FIG. 2 shows a more detailed diagram of the phase generator 30 and of the standby charge pump 32.

In particular, the phase generator 30 comprises an oscillator 40 comprising a plurality of inverters 41, in an odd number and connected together to form a loop. An enabling node 42 is connected, via an enabling switch 43, preferably formed by a PMOS transistor, to a supply line 44 supplying a supply voltage $V_{CC}$, for example 3 V. In addition, the enabling node 42 is connected to an input of a toggle-type flip-flop 45 having a set terminal connected to the control unit 20, supplying the standby signal SB.

An OR gate 46 has a first input connected to the output of the comparator 27, a second input connected to an output of the flip-flop 45, and an output connected to a control terminal of the enabling switch 43.

The phase generator 30 further comprises a selector 47 having a first selectable input 47a connected to the output of the flip-flop 45, a second selectable input 47b connected to the control unit 20 supplying the active operation timing signal CK1, a selection terminal 47c receiving the frequency selection signal SEL, and an output defining the phase output 30a of the phase generator 30.

The standby charge pump 32 comprises a driving circuit 49 and a pump device 50.

The driving circuit 49 comprises a first driving inverter 51 and a second driving inverter 52. The first driving inverter 51 has an input connected to the phase output 30a and an output forming a first phase terminal 53 of the driving circuit 49, supplying a first phase A having a frequency equal to the frequency of the phase signal CK. The second driving inverter 52 has an input connected to the first phase terminal 53 and an output forming a second phase terminal 54 of the driving circuit 49, supplying a second phase B, which is phase-shifted 180° with respect to the first phase A.

The pump device 50 comprises a first stage 55a, a second stage 55b, and a third stage 55c, cascade-connected, each of which includes a charge capacitor 56 and a diode 57. In particular, each diode 57 has a cathode terminal connected to a first terminal of a respective charge capacitor 56. In addition, the diode 57 belonging to the first stage 55a has its anode terminal connected to the supply line 44, and a cathode terminal of the diode 57 belonging to the third stage 55c forms the high voltage output 33 of the standby charge pump 32.

Second terminals of the charge capacitors 56 form phase inputs of the first stage 55a, second stage 55b, and third stage 55c. In detail, the phase inputs of the first and third stages 55a 55c are connected to the first phase terminal 53, whereas the phase input of the second stage 55b is connected to the second phase terminal 54.

The operation of the phase generator 30 is described hereinbelow. During operation of the memory 1 in the standby state, the standby signal SB enables the flip-flop 45, and the frequency selection signal SEL is set by the auxiliary regulator 37 at the low logic level and controls the selector 47 so as to connect the phase output 30a to the first selectable input 47a.

If the intermediate voltage $V_X$ is smaller than the reference voltage $V_{REF}$ (i.e., if the standby voltage $V_{SB}$ is smaller than the regulated read voltage $V_{RR}$), the control signal $V_C$ is set at the high logic level. Consequently, also the output of the OR gate 46 supplies the high logic level to the control terminal of the enabling switch 43, thus causing the enabling switch 43 to open and to trigger oscillation of the oscillator 40. In this way, the flip-flop 45, operating as a frequency divider, generates and supplies to the selector 47 a standby timing signal CK2 having a frequency equal to half the oscillation frequency of the oscillator 40. Consequently, the phase signal CK present on the phase output of the phase generator 30 is equal to the standby timing signal CK2, which is oscillating, and the driving circuit 49 is able to operate the pump device 50, thus supplying the first phase A and the second phase B.

When the intermediate voltage $V_X$ exceeds the reference voltage $V_{REF}$, the control signal $V_C$ is set at the low logic level. In this condition, the output of the OR gate 46 is at the low logic level if also the output of the flip-flop 45 is at the low logic level. Otherwise, the output of the OR gate 46 remains at the high logic level until the subsequent switching of the flip-flop 45, then goes to the low logic level and remains there.

As soon as the output of the OR gate 46 reaches the low logic level, the enabling switch 43 is closed. Consequently, the enabling node 42 is connected to the supply line 44 at a constant voltage, and the oscillation of the oscillator 40 is stopped. The flip-flop 45 therefore supplies a constant logic level (namely, the low logic level), the phase signal CK does not oscillate, and hence the driving circuit 49 is not able to drive the pump device 50, which is thus deactivated.

When the memory 1 is in the active operating state, the standby signal SB deactivates the flip-flop 45 and the output of the flip-flop 45 feeds the first selectable input 47a of the selector 47 with a constant logic level, for example, low.

If the boosted voltage $V_P$ on the high voltage output is greater than a preset threshold, the auxiliary regulator 37 sets the frequency selection signal SEL at the low logic level and controls the selector 47 so as to connect the phase output 30a with the first selectable input 47a. Consequently, the phase signal CK does not oscillate, and the driving circuit 49 supplies constant values both for the first phase A and for the second phase B, so interrupting the operation of the pump device 50.

If, instead, the boosted voltage $V_P$ is lower than the aforesaid preset threshold, the auxiliary regulator 37 sets the frequency selection signal SEL at the high logic level and controls the selector 47 so as to connect the phase output 30a with the second selectable input 47b. Thereby, the phase signal CK is equal to the active operation timing signal CK1, which is oscillating, and the driving circuit 49 operates the pump device 50 through the first and second phases A, B.

Figure 3:
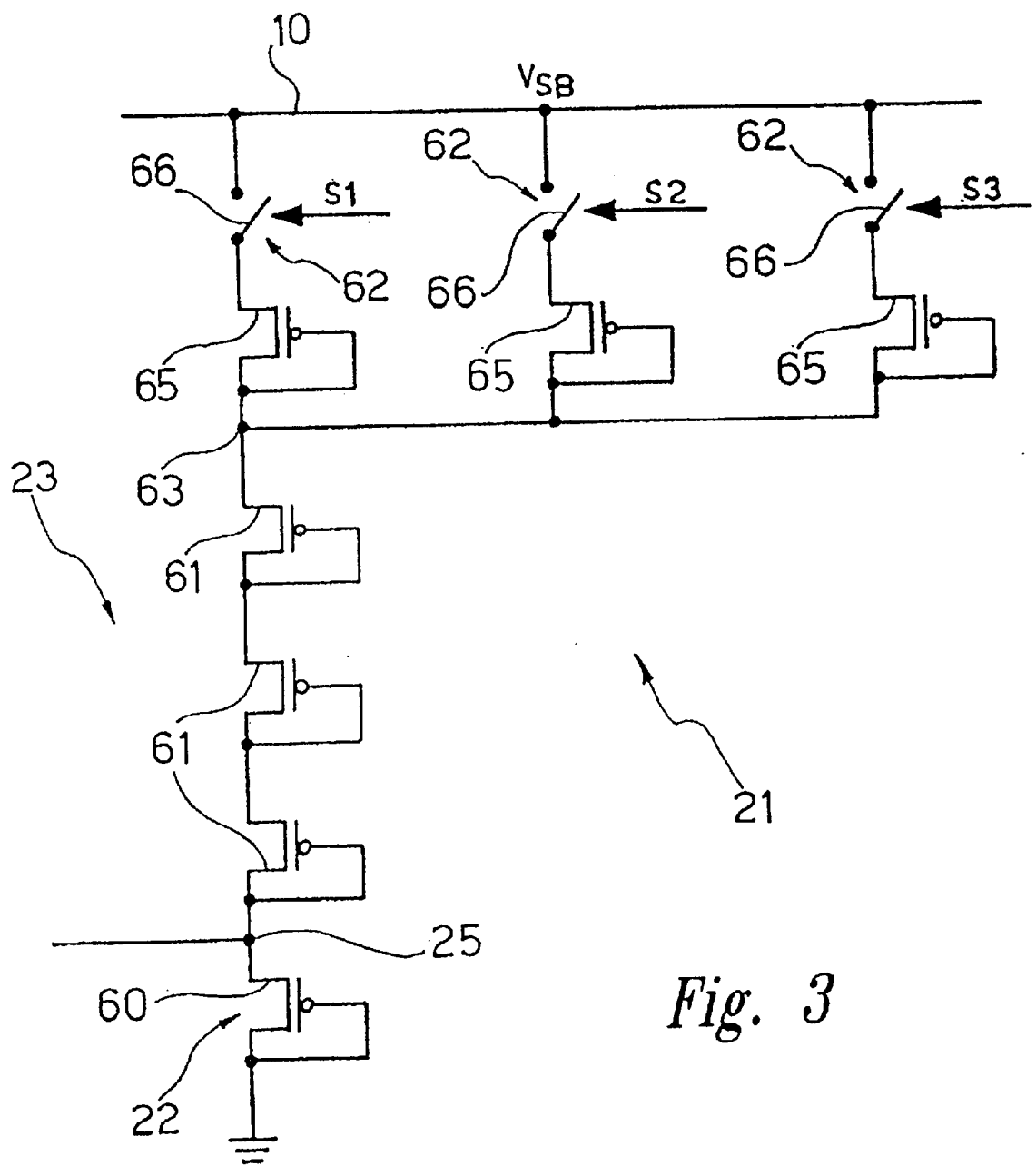
FIG. 3 is a simplified circuit diagram of a detail of the device of FIG. 1.

FIG. 3 shows a circuit diagram of the divider 21. In particular, the first resistive element 22 of the divider 21 comprises a first transistor 60, of PMOS type, diode-connected, having its gate terminal and drain terminal short-circuited and grounded, and its source terminal connected to the intermediate node 25. In addition, the first transistor 60 has a nominal form factor (W/L).

The second resistive element 23 comprises a plurality of second transistors 61, of PMOS type, having a form factor equal to the nominal form factor (W/L), and a number N of selectable branches 62, for example three. In particular, the second transistors 61 are diode-connected, i.e., they have their gate and drain terminals connected together, and are coupled in series between the intermediate node 25 and a third node 63.

The selectable branches 62 are connected in parallel and each of them comprises a selectable transistor 65 and a selection switch 66. In detail, each selectable transistor 65, of PMOS type and diode-connected, has its gate and drain terminals connected to the third node 63, and its source terminal connected to the output terminal 10 via a respective selection switch 66. One among the selectable transistors 65 has a form factor equal to the nominal form factor (W/L), and the others have preset form factors different from the nominal form factor (W/L) and different from one another.

In addition, the selection switches 66, comprising, for example, PMOS transistors, receive respective selection signals S1, S2, . . . , SN on respective control terminals.

The dividing ratio of the divider 21 can be modified by inserting, through the selection signals S1, S2, . . . , SN, an appropriate selectable branch 62. In particular, only one of the selection signals S1, S2, . . . , SN is set at the high logic level, corresponding to a high voltage value, such as to control closing of the corresponding selection switch 66, while the other selection switches 66 remain open. Since, as known, the resistivity of MOS transistors depends upon the form factor, it is clear that the voltage drop between the output node 10 and the third node 63, and consequently the dividing ratio of the divider 21, depend upon which selectable transistor 65 has been inserted.

The voltage boost device according to the present invention has the following advantages. First, it allows the standby voltage on the output terminal 10 to remain at a value close to the regulated read voltage necessary for reading throughout the standby state operation. Consequently, it is not necessary to wait for charge or stabilization transients when the memory 1 exits the standby state, and thus the time required for reading does not differ from the time required for the same operation during normal functioning in the active state.

In addition, since the standby charge pump is operated only when it is necessary, energy consumption is not substantially increased as compared to memories where all the charge pumps are deactivated in the standby state. Furthermore, the auxiliary regulator 37 allows the boosted voltage $V_P$ to remain at a high value also during active state operation, thus determining a negligible increase in the absorbed power.

A further advantage is due to that the standby voltage $V_{SB}$ is regulated with precision, so as to reduce the risk of reading errors, even in the case of multilevel memories, which are more sensitive.

The structure of the divider 21 advantageously increases the regulation precision of the standby voltage $V_{SB}$. Because of inevitable spread in the process parameters, in fact, the reference voltage $V_{REF}$ may differ from the nominal value. Since the divider 21 includes selectable transistors 65 having different form factors, it is possible to vary the dividing ratio of the divider 21 and to compensate any deviations of the reference voltage $V_{REF}$ from the nominal value.

In addition, the use of MOS transistors in the divider 21 enables high resistance values, and hence reduced consumption, for just a small area occupied. In particular, the resistance obtainable with a MOS divider is such as not to increase significantly the discharge currents of the output terminal 10 of the voltage boost device 3.

Finally, it is clear that numerous variations and modifications may be made to the voltage boost device described and illustrated herein, all falling within the scope of the invention, as defined in the attached claims.

What is claimed is:

1. A voltage boost device comprising:
a supply line supplying a supply voltage;
an input terminal receiving an operating condition signal having a first logic level, representing a standby operation state, and a second logic level, representing an active operation state;
an output terminal supplying an output voltage higher than said supply voltage;
a first voltage boost stage connected to said supply line;
a second voltage boost stage connected to said supply line; and
a switch circuit connected between the first and second voltage boost stages and said output terminal, the switch circuit coupled to receive the first and second logic levels to selectively connect the first voltage boost stage to the output terminal, or alternatively, the second voltage boost stage to the output terminal;
said first voltage boost stage being enabled in the presence of said second logic level of said operating condition signal and being disabled in the presence of said first logic level of said operating condition signal, and said second voltage boost stage being controlled in a first operating condition in the presence of said first logic level of said operating condition signal, and being controlled in a second operating condition in the presence of said second logic level of said operating condition signal.

2. The voltage boost device according to claim 1, wherein the switch circuit includes a first switch that is coupled between said first voltage boost stage and said output terminal, and a second switch that is coupled between said second voltage boost stage and said output terminal, said first switch being closed in the presence of said second logic level and being open in the presence of said first logic level of said operating condition signal, and said second switch being open in the presence of said second logic level and being closed in the presence of said first logic level of said operating condition signal.

3. The voltage boost device according to claim 2, wherein said second voltage boost stage comprises:
a charge pump device having a control input and a high voltage output which is connected to said output terminal via said second switch means and generates a boosted voltage;
self-activation means having an input connected to said output terminal, an activation input receiving said operating condition signal, and a phase output connected to said control input of said charge pump circuit; said self-activation means generating a standby timing signal supplied on said phase output when said output voltage is lower than a first preset threshold value and in presence of said first logic level of said operating condition signal.

4. The voltage boost device according to claim 3, wherein said self-activation means comprises:
a divider set between said output terminal and a reference potential line and having an intermediate node at an intermediate voltage;

comparator means having a first input connected to said intermediate node, a second input receiving a constant reference voltage, and an output supplying a control signal; and phase generating means controlled by said control signal and generating said standby timing signal.

5. The voltage boost device according to claim 4, wherein said second switch means comprises high voltage switches, and wherein a voltage boost circuit having a supply input connected to said high voltage output of said charge pump circuit and an output generating a closing signal for said high voltage switches when the value of said output voltage is lower than said first preset threshold value.

6. The voltage boost device according to claim 5, wherein said voltage boost circuit comprises an enabling input receiving said operating condition signal and controlling opening of said switch means in presence of said first level of said operating condition signal.

7. The voltage boost device according to claim 4, wherein said phase generating means comprises:

an oscillator circuit generating said standby timing signal;

a selector stage having a first input connected to said oscillator circuit, a second input receiving an active operation timing signal, a third input receiving a selection signal having a first and a second logic levels, and an output selectively supplying said standby timing signal and said active operation timing signal according to said logic levels of said selection signal, said selection signal having said first logic level in presence of said second level of said operating condition signal and having said second logic level in presence of said first level of said operating condition signal, when said boosted voltage is lower than a second preset threshold value.

8. The voltage boost device according to claim 4, wherein said divider has a variable dividing ratio.

9. The voltage boost device according to claim 8, wherein said divider comprises a first resistive element including a first transistor having its gate and drain terminals connected to said reference potential line, and its source terminal connected to said intermediate node; and a second resistive element comprising a plurality of second transistors and a plurality of selectable branches.

10. The voltage boost device according to claim 9, wherein each of said selectable branches comprises a respective selectable transistor having its gate and drain terminals connected to a node, and its source terminal connected to said output terminal through a respective selection switch.

11. The voltage boost device according to claim 10, wherein said selectable transistors have respective form factors that are different from one another.

12. The voltage boost device according to claim 9, wherein said second transistors have respective form factors that are identical to that of said first transistor.

13. A method comprising:

putting a load device in standby mode while active operation of said device is not required;

disabling a primary voltage boost device when said load device is in standby mode;

measuring a voltage level at an input terminal of said load device;

placing a first logic level on an input terminal of a secondary voltage boost device in the event that said voltage level exceeds a selected value, to cause said secondary voltage boost device to be disabled;

placing a second logic level on said input terminal of said secondary voltage boost device in the event that said voltage level does not exceed the selected value, to cause said secondary voltage boost device to be enabled.

14. Method according to claim 13, wherein an output voltage of said secondary voltage boost device exceeds said selected value.

15. Method according to claim 13, wherein an output terminal of said secondary voltage boost device is connected to said input terminal of said load device.

16. A voltage boost device comprising:

a load device having an input terminal coupled to receive a boosted voltage;

a primary voltage boost stage that is enabled while said load device is in an active operating mode, said primary boost stage providing sufficient power for active operation of said load device;

a secondary voltage boost stage that is enabled while said load device is in a standby mode, said secondary voltage boost device providing sufficient power to maintain a desired voltage level at said input terminal while said load device is in a standby mode; and a switching circuit coupled between the primary voltage boost stage and the secondary voltage boost stage, to couple the primary voltage boost stage to the input of the load device while in the active operating mode, or alternatively, to couple the secondary voltage boost stage to the input of the load device while in the standby mode.

17. Voltage boost device according to claim 16, wherein said primary voltage boost stage is disabled while said memory device is in standby mode.

18. Voltage boost device according to claim 16, wherein said load device is a memory device.

19. Voltage boost device according to claim 16, wherein said secondary boost device is enabled while said load device is in active operating mode.

20. Voltage boost device according to claim 19, wherein operation of said secondary voltage boost device comprises:

intermittent active operation as required to maintain voltage at said input terminal at said desired voltage level while said primary boost stage is disabled;

intermittent active operation as required to maintain voltage at said input terminal at said desired voltage level while said primary boost stage transitions from disabled to enabled;

intermittent active operation as required to maintain an internal charge at said desired value during active operation of said load device.

21. A voltage boost device comprising:

a supply line supplying a supply voltage;

an input terminal receiving an operating condition signal having a first logic level, representing a standby operation state, and a second logic level, representing an active operation state;

an output terminal supplying an output voltage higher than said supply voltage; and a first voltage boost stage connected to said supply line, a second voltage boost stage connected to said supply line; and said first voltage boost stage being enabled in the presence of said second logic level of said operating condition signal and being disabled in the presence of said first logic level of said operating condition signal, and said second voltage boost stage being controlled in a first operating condition in the presence of said first logic level of said operating condition signal, and being controlled in a second operating condition in the presence of said second logic level of said operating condition signal, wherein a first switch is coupled between said first voltage boost stage and said output terminal, and a second switch is coupled between said second voltage boost stage and said output terminal, said first switch being closed in the presence of said second logic level and being open in the presence of said first logic level of said operating condition signal, and said second switch being open in the presence of said second logic level and being closed in the presence of said first logic level of said operating condition signal.

22. The voltage boost device according to claim 21 wherein said second voltage boost stage comprises:

a charge pump circuit having a control input and a high voltage output which is connected to said output terminal via said second switch and generates a boosted voltage;

self-activation circuit having an input connected to said output terminal, an activation input receiving said operating condition signal, and a phase output coupled to said control input of said charge pump circuit; said self-activation circuit generating a standby timing signal supplied on said phase output when said output voltage is lower than a first preset threshold value and in the presence of said first logic level of said operating condition signal.

23. The voltage boost device according to claim 22 wherein the said self-activation circuit comprises:

a divider set between said output terminal and a reference potential line, and said divider having an intermediate node at an intermediate voltage:

comparator circuit having a first input connected to said intermediate node, a second input receiving a constant reference voltage, and an output supplying a control signal; and phase generating circuit controlled by said control signal and generating said standby timing signal.

24. The voltage boost device according to claim 23, wherein said second switch comprises high voltage switches, and wherein a voltage boost circuit having a supply input connected to said high voltage output of said charge pump circuit and an output generating a closing signal for said high voltage switches when the value of said output voltage is lower than said first preset threshold value.

25. The voltage boost device according to claim 24, wherein said voltage boost circuit comprises an enabling input receiving said operating condition signal and controlling opening of said switch circuit in the presence of said first level of said operating condition signal.

* * * * *